(12) United States Patent
Yang

(10) Patent No.: US 12,231,228 B2
(45) Date of Patent: Feb. 18, 2025

(54) TECHNIQUES FOR ENABLING AND DISABLING OF A SERIALIZER/DESERIALIZER

(71) Applicant: Micron Technology, Inc., Boise, ID (US)

(72) Inventor: Dongdong Yang, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 109 days.

(21) Appl. No.: 17/584,083

(22) Filed: Jan. 25, 2022

(65) Prior Publication Data
US 2023/0239062 A1 Jul. 27, 2023

(51) Int. Cl.
*H04J 3/04* (2006.01)
*H04J 3/06* (2006.01)

(52) U.S. Cl.
CPC ............ *H04J 3/047* (2013.01); *H04J 3/0629* (2013.01)

(58) Field of Classification Search
CPC ................................ H04J 3/047; H04J 3/0629
USPC ......................................................... 375/262
See application file for complete search history.

(56) References Cited

U.S. PATENT DOCUMENTS

| 10,412,673 | B2 * | 9/2019 | Levy | G06F 1/3278 |
| 2015/0019887 | A1 * | 1/2015 | Yu | H04L 49/351 |
| | | | | 713/310 |
| 2021/0153033 | A1 * | 5/2021 | Peleg | H04W 52/0219 |

* cited by examiner

*Primary Examiner* — Kevin M Burd
(74) *Attorney, Agent, or Firm* — Holland & Hart LLP

(57) ABSTRACT

Methods, systems, and devices for techniques for enabling and disabling of a serializer/deserializer are described. In some examples, a system may be configured to identify information to be transmitted by a serializer/deserializer over a communication channel and activate, based on identifying the information to be transmitted, both a transmission component and a reception component of the serializer/deserializer that are coupled with the communication channel. Additionally or alternatively, in some examples, a system may be configured to identify information to be received by a serializer/deserializer over a communication channel and activate, based on identifying the information to be received, both a transmission component and a reception component of the serializer/deserializer that are coupled with the communication channel.

25 Claims, 4 Drawing Sheets

TECHNIQUES FOR ENABLING AND DISABLING OF A SERIALIZER/DESERIALIZER

FIELD OF TECHNOLOGY

The following relates to one or more systems for memory, including techniques for enabling and disabling of a serializer/deserializer.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
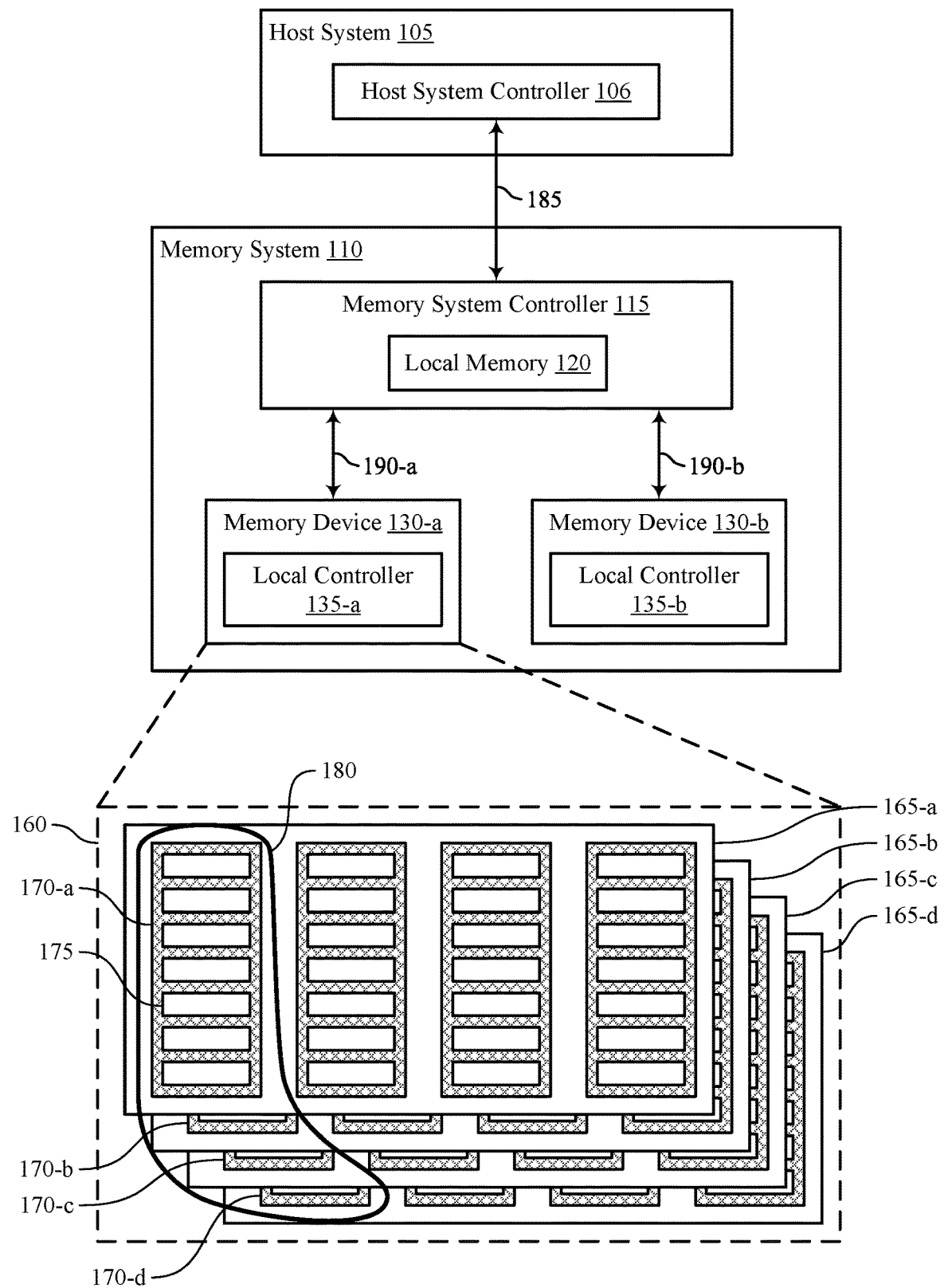
FIG. 1 illustrates an example of a system that supports techniques for enabling and disabling of a serializer/deserializer in accordance with examples as disclosed herein.

In some electronics systems, one component or device may communicate with another component or device via a serial bus (e.g., a serial link, a serial channel), which may be associated with one or more signal paths that are each configured to communicate information in a serial manner (e.g., in accordance with respective portions of information being communicated via a signal path during respective time intervals). In some examples (e.g., associated with information transmission), such communications may involve a serialization of information from a parallel bus, which may be associated with a plurality of signal paths that are configured to communicate information in a parallel manner (e.g., in accordance with respective portions of information being communicated using respective signal paths, which may involve concurrent communications among different signal paths). For example, a serialization may involve receiving respective portions of information via each of a plurality of signal paths (e.g., of a parallel bus) and conveying the respective portions of information during respective intervals (e.g., sequentially) via a single signal path (e.g., of a serial bus) for transmission. Additionally or alternatively, in some examples (e.g., associated with information reception), such communications may involve a deserialization of information from a serial bus. For example, a deserialization may involve receiving respective portions of information during respective intervals (e.g., sequentially) via a single signal path (e.g., of a serial bus) and conveying the respective portions of information using a plurality of signal paths (e.g., of a parallel bus).

In some examples, serialization and deserialization may be associated with communications over a communications channel between components, where at least one if not both components may include a serializer/deserializer component. For example, in some memory implementations, a host system, or a memory system, or both may include a serializer/deserializer to support communications via various channels, such as one or more command/address channels, one or more data channels, or various combinations thereof between the host system and the memory system. Additionally or alternatively, within a memory system, a memory system controller, or a memory device, or both may include a serializer/deserializer to support communications via various channels between the memory system controller and a respective memory device. Serializer/deserializer components may be implemented in other electronics systems beyond memory implementations, such as data transfer, networking, or other communication or interconnection systems.

In some examples, a serializer/deserializer may be selectively activated or deactivated, which may be associated with various power states or other selective coupling or decoupling with various power sources. In some implementations, such techniques may support power savings by powering down or otherwise deactivating a serializer/deserializer, or some portion thereof, in response to communications not being performed, among other scenarios. However, in some examples, activation or deactivation of a serializer/deserializer may be associated with transient behavior, such as power transients or signal transients, which may degrade some aspects of the serializer/deserializer performance. For example, if a reception component of a serializer/deserializer is activated during a transmission by a transmission component of the serializer/deserializer, a signal transmitted by the transmission component may experience a voltage disturbance, a transient current, or other signal noise as a result of the activation of the reception component.

In accordance with examples as disclosed herein, a serializer/deserializer may be configured to support various techniques for selective activation or deactivation while mitigating performance degradation that may otherwise result from associated transient behavior. For example, a system may be configured to identify information to be transmitted by a serializer/deserializer over a communication channel and activate, based on identifying the information to be transmitted, both a transmission component and a reception component of the serializer/deserializer that are coupled with the communication channel. Additionally or alternatively, a system may be configured to identify information to be received by a serializer/deserializer over a communication channel and activate, based on identifying the information to be received, both a transmission component and a reception component of the serializer/deserializer that are coupled with the communication channel. By activating the transmission component and the reception component concurrently, such a system may avoid adverse effects on signal transmission by the transmission component that might otherwise occur from a later activation of the reception component, or may avoid adverse effects on signal reception by the reception component that might otherwise occur from a later activation of the transmission component, among other benefits. Accordingly, such a system may be configured to support a balance of signal integrity performance and power consumption performance.

Features of the disclosure are initially described in the context of a system with reference to FIG. 1. Features of the disclosure are described in the context of a serial communication system with reference to FIG. 2. These and other features of the disclosure are further illustrated by and described in the context of an apparatus diagram and flowchart that relate to techniques for enabling and disabling of a serializer/deserializer with reference to FIGS. 3 and 4.

FIG. 1 illustrates an example of a system 100 that supports techniques for enabling and disabling of a serializer/deserializer in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof.

Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

The system 100 may include any quantity of non-transitory computer readable media that support techniques for enabling and disabling of a serializer/deserializer. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some examples, communications between components of the system 100 may be supported via a serial bus (e.g., a serial link, a serial channel, a communication channel), which may be associated with one or more signal paths that are each configured to communicate information in a serial manner (e.g., in accordance with respective portions of information being communicated via a signal path during respective time intervals). For example, communication between the host system 105 and the memory system 110 may be supported via a serial bus 185 (e.g., a communication channel between the host system controller 106 and the memory system controller 115). Additionally or alternatively, communication between the memory system controller 115 and the memory devices 130-a and 130-b may be supported via serial buses 190-a or 190-b, respectively (e.g., a respective communication channel between the memory system controller 115 and the local controllers 135-a and 135-b). In various examples, a serial bus 185 or a serial bus 190 may support bidirectional communications, which may involve respective sets of one or more isolated signal paths for each signaling direction (e.g., to support full duplex communications via the respective communication channel).

In some examples, communications via a serial bus 185 or a serial bus 190 may involve a serialization of information from a parallel bus of a transmitting component or device, or may involve a deserialization of information from a serial bus at a receiving component or device. In some such examples, at least one if not both communicating components or devices may include a serializer/deserializer component. For example, a host system controller 106, a memory system controller 115, or a local controller 135, or any combination thereof, may include or otherwise be associated with a respective serializer/deserializer to support communications via various channels. In some examples, a signal path of a bus may be configured for bidirectional communications such that over a first duration the signal path may be used to communicate signals in a first direction and over a second duration the signal path may be sued to communicate signals in a second direction. In some examples, signal paths may be relatively close to another, either unidirectional signal paths or bidirectional signal paths. In some examples, components for both transmission and reception and components for both serialization and deserialization may be in relatively close proximity to facilitate communication over signal paths.

In accordance with examples as disclosed herein, a serializer/deserializer (e.g., of the system 100) may be configured to support various techniques for selective activation or deactivation while mitigating performance degradation that may otherwise result from associated transient behavior. For example, one or more components of the system 100 may be configured to identify information to be transmitted by a serializer/deserializer over a communication channel and activate, based on identifying the information to be transmitted, both a transmission component and a reception component of the serializer/deserializer that are coupled with the communication channel. Additionally or alternatively, one or more components of the system 100 may be configured to identify information to be received by a serializer/deserializer over a communication channel and activate, based on identifying the information to be received, both a transmission component and a reception component of the serializer/deserializer that are coupled with the communication channel. By activating the transmission component and the reception component concurrently, the system 100 may avoid adverse effects on signal transmission by the transmission component that might otherwise occur from a later activation of the reception component, or may avoid adverse effects on signal reception by the reception component that might otherwise occur from a later activation of the transmission component, among other benefits. Accordingly, the system 100 may be configured to support a balance of signal integrity performance and power consumption performance.

Figure 2:
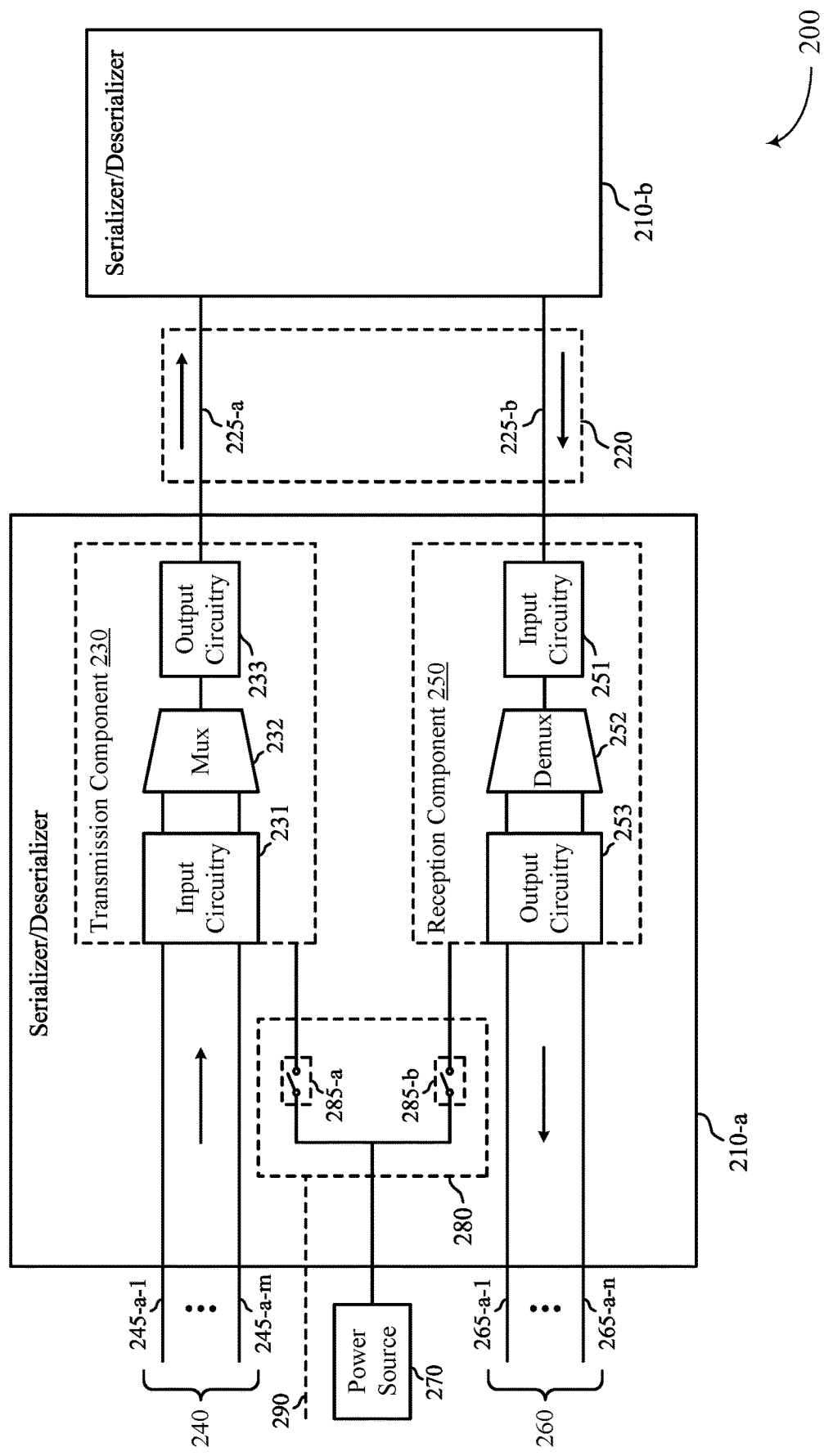
FIG. 2 illustrates an example of a serial communication system that supports techniques for enabling and disabling of a serializer/deserializer in accordance with examples as disclosed herein.

FIG. 2 illustrates an example of a serial communication system 200 that supports techniques for enabling and disabling of a serializer/deserializer in accordance with examples as disclosed herein. The serial communication system 200 includes a serializer/deserializer 210-a that is configured for communications over a communication channel 220. In some examples, the serializer/deserializer 210-a may be a component of a host system 105 (e.g., of or otherwise associated with a host system controller 106), of a memory system 110 (e.g., of or otherwise associated with a memory system controller 115), or of a memory device 130-a (e.g., of or otherwise associated with a local controller 135), among other devices or systems that may perform communications over a serial bus. In the example of serial communication system 200, the serializer/deserializer 210-a may be configured for communication with another serializer/deserializer 210-b (e.g., a peer serializer/deserializer), which may be configured similarly to the serializer/deserializer 210-a, in some cases. However, in some other examples, a serializer/deserializer 210 may be configured for communications with another peer component or device that does not perform internal communications or processing in accordance with a parallel bus. Therefore, a serializer/deserializer 210 in accordance with the described techniques may be configured for or otherwise implemented for communications with another serializer/deserializer 210.

The communication channel 220 may be associated with a set of signal paths 225 (e.g., signal paths 225-*a* and 225-*b*, which may be electrically isolated from one another) which may be configured to support bidirectional signaling of the communication channel 220. The communication channel 220 may be associated with a serial bus architecture, such as a peripheral component interconnect (PCI) bus, a SCSI bus, a SATA bus, a universal serial bus (USB), or an Ethernet bus, among other serial bus architectures. In the example of serial communication system 200, the signal path 225-*a* may be associated with communication transmitted by the serializer/deserializer 210-*a* and the signal path 225-*b* may be associated with communication received by the serializer/deserializer 210-*a*. Accordingly, the signal paths 225-*a* and 225-*b* may support full duplex communications between the serializer/deserializer 210-*a* and the serializer/deserializer 210-*b* or other peer. Although the communication channel 220 is illustrated with a single signal path 225 for each signaling direction, the described techniques may be implemented for a serializer/deserializer 210 to support a communication channel 220 having any quantity of one or more signal paths 225 in each signaling direction.

The serializer/deserializer 210-*a* may include a transmission component 230, which may be configured to convert a parallel data stream (e.g., conveyed by m signal paths 245 of a parallel bus 240) into a serial data stream (e.g., conveyed by the signal path 225-*a* of the communication channel 220). Accordingly, the transmission component 230, or some portion thereof, may be referred to as a Parallel In Serial Out (PISO) block or a Parallel-to-Serial converter. In some examples, the transmission component 230 may be configured to embed a clock signal in the serial data stream, which may be used by a receiving component (e.g., the serializer/deserializer 210-*b* or other peer) for deserializing or otherwise decoding the serial data stream. The transmission component 230, or various components thereof, may be referred to as a transmission component associated with a serializer or serializing functionality of the serializer/deserializer 210-*a*. For illustrative purposes, the transmission component 230 may be described with reference to input circuitry 231, a multiplexer 232, and output circuitry 233. However, a transmission component 230 may be configured with or described with reference to different constituent components.

The input circuitry 231 may refer to various circuitry configured to receive or otherwise convey signals from a set of m signal paths 245 (e.g., signal paths 245-*a-1* through 245-*a-m*) of the parallel bus 240. In some examples, the input circuitry 231 may include a set of latches (e.g., input latches) each corresponding to a respective one of the signal paths 245. In some examples, such latches may be triggered by a clock signal (e.g., a clock signal at a parallel rate), which may be generated by a transmit clock generator (not shown) that is included in or coupled with the transmission component 230. In some examples, such a transmit clock generator may be synchronized with one or more other clock generators (e.g., a clock generator of the reception component 250) via phase-locked loop (PLL) circuitry included in or otherwise associated with the serializer/deserializer 210-*a*. In some examples, the input circuitry 231 may include input monitoring circuitry (e.g., a detection portion), which may be used to evaluate a presence or absence of signaling on the parallel bus 240 to be serialized by the multiplexer 232.

The multiplexer 232 may be configured to serialize data from the m signal paths 245 to be conveyed via the single signal path 225-*a*, and accordingly may be referred to as an m-to-one multiplexer. In some examples, the multiplexer 232 may be triggered by a clock signal (e.g., a clock signal at a serial rate), which may be generated based on a clock signal at a parallel rate and clock multiplication circuitry (e.g., of PLL circuitry included in or coupled with the transmission component 230). In some examples, a clock signal at a serial rate for the transmission component 230 may have a frequency that is a factor of m greater than a clock signal at a parallel rate for the transmission component 230.

The output circuitry 233 may refer to various circuitry configured to transmit or otherwise convey signals (e.g., serialized signals) over the signal path 225-*a* of the communication channel 220 (e.g., of a serial bus). In some examples, the output circuitry 233 may include a line driver configured to drive a voltage or current on the signal path 225-*a* to convey the serialized information. In various examples, such a line driver may be configured to bias the signal path 225-*a* relative to a reference voltage (e.g., a ground voltage, a chassis ground), or such a line driver may be configured to establish a bias between a pair of signal paths 225 (e.g., a 'positive' transmit signal path and a 'negative' or 'neutral' transmit signal path), among other configurations.

The serializer/deserializer 210-*a* also may include a reception component 250, which may be configured to convert a serial data stream (e.g., conveyed by the signal path 225-*b* of the communication channel 220) into a parallel data stream (e.g., conveyed by n signal paths 265 of a parallel bus 260, where n may be equal to m, in some cases; in other cases n may be different than m). Accordingly, the reception component 250, or some portion thereof, may be referred to as a Serial In Parallel Out (SIPO) block or a Serial-to-Parallel converter. The reception component 250, or various components thereof, may be referred to as a reception component associated with a deserializer or deserializing functionality of the serializer/deserializer 210-*a*. For illustrative purposes, the reception component 250 may be described with reference to input circuitry 251, a demultiplexer 252, and output circuitry 253. However, a reception component 250 may be configured with or otherwise described with reference to different constituent components.

The input circuitry 251 may refer to various circuitry configured to receive or otherwise convey signals from the signal path 225-*b* of the communication channel 220 (e.g., of a serial bus). In some examples, the input circuitry 251 may include a latch (e.g., an input latch) corresponding to the signal path 225-*b*. In some examples, such a latch may be triggered by a clock signal (e.g., a clock signal at a serial rate), which may be extracted or otherwise generated based on the signaling via the signal path 225-*b*, or based on a receive clock generator (not shown) that is included in or coupled with the reception component 250, or some combination thereof. In some examples, such a receive clock generator may be synchronized with one or more other clock generators (e.g., a clock generator of the transmission component 230) via phase-locked loop (PLL) circuitry included in or otherwise associated with the serializer/deserializer 210-*a*. In some examples, the input circuitry 251 may include input monitoring circuitry (e.g., a detection portion), which may be used to evaluate a presence or absence of signaling on the signal path 225-*b* to be deserialized by the demultiplexer 252.

The demultiplexer 252 may be configured to deserialize data from the single signal path 225-*b* to be conveyed via the n signal paths 265, and accordingly may be referred to as a one-to-n demultiplexer. In some examples, the demultiplexer 252 may be triggered by one or more clock signals (e.g., a set of clock signals each at a parallel rate), which may be generated based on a clock signal at a serial rate and clock division circuitry (e.g., of PLL circuitry included in or coupled with the transmission component 230). In some examples, a clock signal at a serial rate for the reception component 250 may have a frequency that is a factor of n greater than a clock signal at a parallel rate for the reception component 250.

The output circuitry 253 may refer to various circuitry configured to transmit or otherwise convey signals (e.g., a deserialized signal, a set of deserialized signals) over the n signal paths 265 of the parallel bus 260. In some examples, the output circuitry 253 may include a set of line drivers or output latches each configured to drive a voltage or current on a respective signal path 265 to convey the parallelized information. In various examples, such a line driver or output latch may be configured to bias the respective signal path 265 relative to a reference voltage (e.g., a ground voltage, a chassis ground), or such a line driver may be configured to establish a bias between a pair of signal paths 265.

Operations of the components and circuitry of the serializer/deserializer 210-a may be supported by a power source 270 (e.g., a common power bus), which may provide power to the serializer/deserializer 210-a in accordance with one or more voltage levels. For example, the power source 270 may include one or more voltage sources configured to support the various operations of the serializer/deserializer 210-a. In some examples, components of the serializer/deserializer 210-a may be selectively activated or deactivated, which may be associated with various power states or other selective coupling or decoupling between the power source 270 and circuitry of the serializer/deserializer 210-a. For example, the serializer/deserializer 210-a may include an activation component 280, which may include one or more switching components 285 configured to couple or isolate the power source 270 and circuitry of the transmission component 230 or the reception component 250. For illustrative purposes, the activation component 280 includes a first switching component 285-a generally coupled between the power source 270 and the transmission component 230 and a switching component 285-b generally coupled between the power source 270 and the reception component 250. However, an activation component 280 may include any quantity of switching components 285, which may support various techniques of coupling and isolation between the power source 270, or one or more voltage sources thereof, and at least a portion of the serializer/deserializer 210-a, in accordance with examples as disclosed herein.

In some implementations, selective activation and deactivation may support power savings by powering down or otherwise deactivating (e.g., idling) circuitry of the serializer/deserializer 210-a, or some portion thereof, in response to communications not being performed, among other scenarios. However, in some examples, activation or deactivation of at least a portion of the serializer/deserializer 210-a may be associated with transient behavior, such as power transients or signal transients, which may degrade some aspects of the operation of the serializer/deserializer 210-a. For example, if at least a portion of the reception component 250 is activated (e.g., from an idle or deactivated state) during a transmission by the transmission component 230, a signal transmitted by the transmission component 230 may experience a voltage disturbance, a transient current, or other signal disturbance as a result of the activation of the reception component 250. Thus, in accordance with examples as disclosed herein, an activation component 280 may be configured to support various techniques for selective activation or deactivation of circuitry of the transmission component 230 and the reception component 250 while mitigating performance degradation that may otherwise result from associated transient behavior.

In some examples, a component of the serializer/deserializer 210-a may be configured to identify information to be transmitted over the communication channel 220 (e.g., via the transmission component 230), and the activation component 280 may be configured to activate, based on the identification of information to be transmitted, at least a portion of both the transmission component 230 and the reception component 250. In other words, for illustrative purposes, the activation component 280 may be configured to activate both the switching component 285-a and the switching component 285-b based on identifying information to be transmitted over the communication channel 220. However, in some examples, such techniques may involve a more-granular implementation of activations and deactivations than those supported by the illustrated switching components 285-a and 285-b (e.g., as supported by a greater quantity of switching components 285 than illustrated).

The described identification of information to be transmitted by the serializer/deserializer 210-a may be provided in accordance with various techniques. In some examples, a signal indicating such information may be provided via a control bus 290, which may be activated (e.g., by a controller) during circumstances when information is to be transmitted by the transmission component 230. Additionally or alternatively, during an idle or inactive state of the transmission component 230, at least a portion the input circuitry 231, such as input monitoring circuitry, may remain enabled (e.g., activated, powered) and, upon an indication of information being conveyed via the parallel bus 240 (e.g., an activation or driving of one or more of the signal paths 245, indicating information to be transmitted by the transmission component 230), the input circuitry 231 may provide an indication to the activation component 280 to activate the transmission component 230 and the reception component 250.

The described activation of the transmission component 230 and the reception component 250 also may be supported in accordance with various techniques. For example, if an indication of information to be transmitted via the transmission component 230 is provided via a control bus 290, the transmission component 230 may be powered down, such that the indication via the control bus 290 may be responded to (e.g., by the activation component 280) with a transition from the transmission component 230 being isolated from the power source 270 (e.g., in accordance with a first power state) to being coupled with the power source 270 (e.g., in accordance with a second power state). In some examples, such an indication via the control bus 290 may also be responded to with a transition from at least a portion of the reception component 250 being isolated from the power source 270 (e.g., in accordance with a third power state) to being coupled with the power source 270 (e.g., in accordance with a fourth power state). In some such examples, the reception component 250 may be further activated based on an indication of information to be received over the communication channel (e.g., via the signal path 225-b), such as an example where a fourth power state corresponds to an activation of the input circuitry 251 (e.g., input monitoring circuitry of the input circuitry 251, a detection portion of the reception component) and a fifth power state, initiated based on the indication of information to be received, corresponds to an activation of the demultiplexer 252, or the output circuitry 253, or both.

In some examples, if an indication of information to be transmitted via the transmission component 230 is provided via the input circuitry 231, the input circuitry 231 may remain powered or otherwise activated in an idle or deactivated state (e.g., in accordance with a first power state). In such examples, an indication of information to be transmitted (e.g., from at least a portion of the input circuitry 231 or from the control bus 290) may be responded to (e.g., by the activation component 280) with a transition from another portion of the input circuitry 231, or the multiplexer 232, or the output circuitry 233, or various combinations thereof being isolated from the power source 270 (e.g., in accordance with the first power state) to being coupled with the power source 270 (e.g., in accordance with a second power state).

Additionally or alternatively, a component of the serializer/deserializer 210-a may be configured to identify information to be received over the communication channel 220 (e.g., via the reception component 250), and the activation component 280 may be configured to activate, based on the identification of information to be received, at least a portion of both the transmission component 230 and the reception component 250. In other words, for illustrative purposes, the activation component 280 may be configured to activate both the switching component 285-a and the switching component 285-b based on identifying information to be received over the communication channel 220. However, in some examples, such techniques may also involve a more-granular implementation of activations and deactivations than those supported by the illustrated switching components 285-a and 285-b.

The described identification of information to be received by the serializer/deserializer 210-a may be provided in accordance with various techniques. In some examples, a signal indicating such information may be provided via a control bus 290, which may be activated (e.g., by a controller, by a chip select or enable signal from a peer such as the serializer/deserializer 210-b) during circumstances when information is to be received by the reception component 250. Additionally or alternatively, during an idle or inactive state of the reception component 250, at least a portion the input circuitry 251, such as input monitoring circuitry, may remain enabled (e.g., activated, powered) and, upon an indication of information being conveyed via the communication channel 220 (e.g., an activation or driving of the signal path 225-b, indicating information to be received by the reception component 250), the input circuitry 251 may provide an indication to the activation component 280 to activate the transmission component 230 and the reception component 250.

The described activation of the transmission component 230 and the reception component 250 also may be supported in accordance with various techniques. For example, if an indication of information to be received via the reception component 250 is provided via a control bus 290, the reception component 250 may be powered down, such that the indication via the control bus 290 may be responded to (e.g., by the activation component 280) with a transition from the reception component 250 being isolated from the power source 270 to being coupled with the power source 270. In some examples, such an indication via the control bus 290 may also be responded to with a transition from at least a portion of the transmission component 230 being isolated from the power source 270 to being coupled with the power source 270. In some such examples, the transmission component 230 may be further activated based on an indication of information to be transmitted over the communication channel (e.g., via the signal path 225-a), such as an example where an initial activation corresponds to an activation of the input circuitry 231 (e.g., input monitoring circuitry of the input circuitry 231, a detection portion of the transmission component) and a subsequent activation, initiated based on the indication of information to be transmitted, corresponds to an activation of the multiplexer 232, or the output circuitry 233, or both.

In some examples, if an indication of information to be received via the reception component 250 is provided via the input circuitry 251, the input circuitry 251 may remain powered or otherwise activated in an idle or deactivated state (e.g., in accordance with a first power state). In such examples, an indication of information to be received (e.g., from at least a portion of the input circuitry 251 or from the control bus 290) may be responded to (e.g., by the activation component 280) with a transition from another portion of the input circuitry 251, or the demultiplexer 252, or the output circuitry 253, or various combinations thereof being isolated from the power source 270 (e.g., in accordance with the first power state) to being coupled with the power source 270 (e.g., in accordance with a second power state).

In some examples, a commonly-initiated activation of at least a portion of each of the transmission component 230 and the reception component 250 may be based on a type of signaling communicated via the serializer/deserializer 210-a. For example, a simultaneous or concurrent activation may be performed in circumstances where information to be transmitted by the transmission component 230 is associated with a reception of signaling (e.g., by the reception component 250) that is responsive to the information to be transmitted. In some such examples, where information to be transmitted by the transmission component 230 is not associated with a response, an indication of such information to be transmitted by the transmission component 230 may be responded to with an activation of the transmission component 230 but not the reception component 250. Additionally or alternatively, a simultaneous or concurrent activation may be performed in circumstances where information to be received by the reception component 250 is associated with a transmission of signaling (e.g., by the transmission component 230) that is responsive to the information to be received. In some such examples, where information to be received by the reception component 250 is not associated with a response, an indication of such information to be received by the reception component 250 may be responded to with an activation of the reception component 250 but not the transmission component 230.

In various examples, a deactivation of the transmission component 230, or of the reception component 250, or both may be associated with transient behavior that may affect other operations of the serializer/deserializer 210-a. Thus, in some examples (e.g., where associated transients would not impair other operations), the transmission component 230 may be deactivated while the reception component 250 is operating (e.g., before the reception component 250 is deactivated), or the reception component 250 may be deactivated while the transmission component 230 is operating (e.g., before the transmission component 230 is deactivated). In some other examples (e.g., where associated transients might impair other operations), the transmission component 230 may not be deactivated while the reception component 250 is operating, and the reception component 250 may not be deactivated while the transmission component 230 is operating, which may involve various aspects of simultaneous or otherwise concurrent or commonly-initiated deactivations of the transmission component 230 and the reception component 250.

By activating at least a portion of each of the transmission component 230 and the reception component 250 concurrently and, in some examples, deactivating at least a portion of each of the transmission component 230 and the reception component 250 concurrently, the serializer/deserializer 210-a may avoid adverse effects on signal transmission by the transmission component 230 that might otherwise occur from a later activation or deactivation of the reception component 250, or may avoid adverse effects on signal reception by the reception component 250 that might otherwise occur from a later activation or deactivation of the transmission component 230, among other benefits. Accordingly, the serializer/deserializer 210-a may be configured to support a balance of signal integrity performance and power consumption performance.

Figure 3:
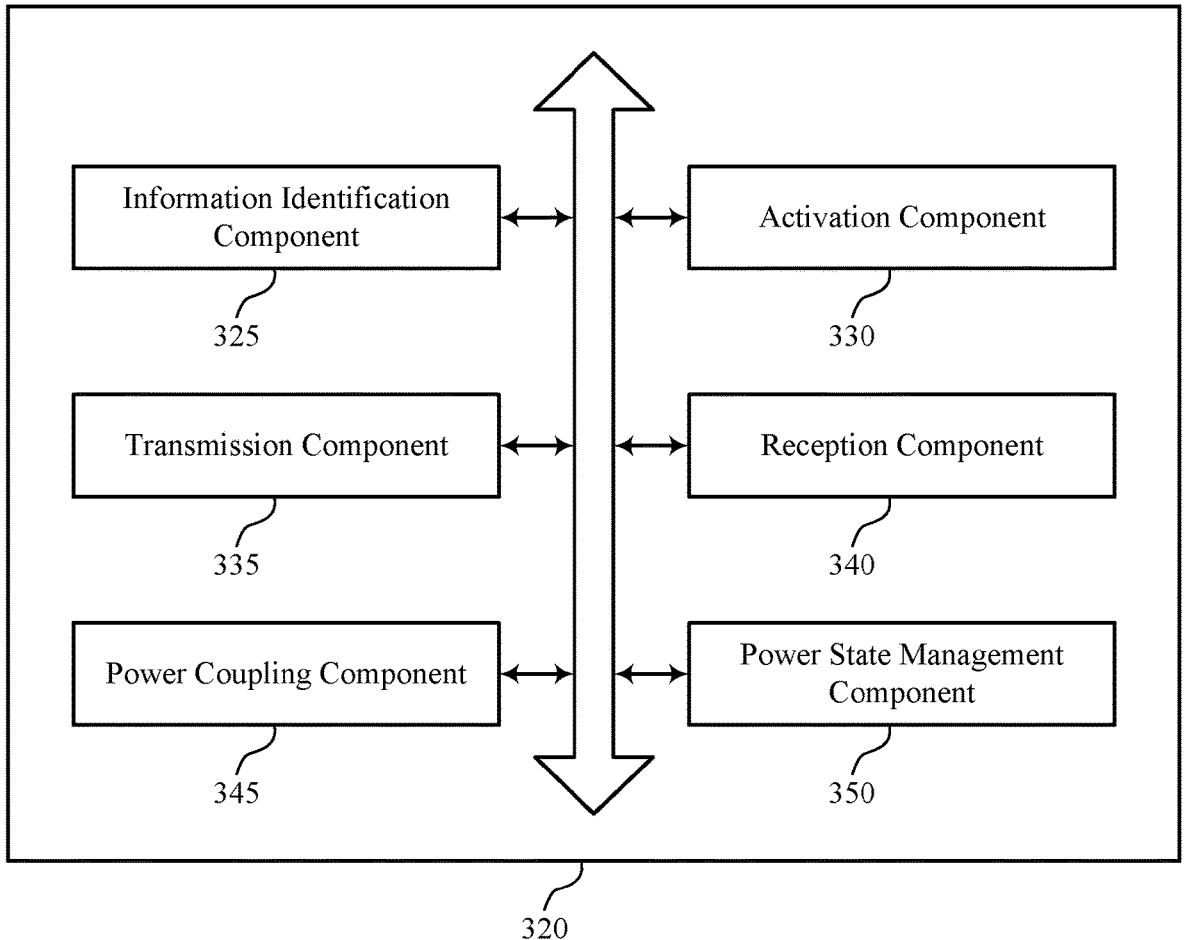
FIG. 3 shows a block diagram of a serializer/deserializer that supports techniques for enabling and disabling of a serializer/deserializer in accordance with examples as disclosed herein.

FIG. 3 shows a block diagram 300 of a serializer/deserializer 320 that supports techniques for enabling and disabling of a serializer/deserializer in accordance with examples as disclosed herein. The serializer/deserializer 320 may be an example of aspects of a serializer/deserializer as described with reference to FIGS. 1 through 2. The serializer/deserializer 320, or various components thereof, may be an example of means for performing various aspects of techniques for enabling and disabling of a serializer/deserializer as described herein. For example, the serializer/deserializer 320 may include an information identification component 325, an activation component 330, a transmission component 335, a reception component 340, a power coupling component 345, a power state management component 350, or any combination thereof. Each of these components may communicate, directly or indirectly, with one another (e.g., via one or more buses). In some examples, the transmission component 335 and the reception component 340 may be coupled with a communication channel (e.g., for communication with one or more peer serializer/deserializers).

The information identification component 325 may be configured as or otherwise support a means for identifying information to be transmitted by the serializer/deserializer 320 over the communication channel (e.g., via the transmission component 335). The activation component 330 may be configured as or otherwise support a means for activating, based at least in part on the information identification component 325 identifying the information, the transmission component 335 and the reception component 340. The transmission component 335 may be configured as or otherwise support a means for transmitting (e.g., by the serializer/deserializer 320) a signal over the communication channel that includes the identified information based at least in part on the activation component 330 activating the transmission component 335 and the reception component 340.

In some examples, the transmission component 335 may be coupled with a first signal path of the communication channel. In some examples, the reception component 340 may be coupled with a second signal path of the communication channel that is isolated from the first signal path.

In some examples, the activation component 330 may be configured as or otherwise support a means for activating the transmission component 335 and the reception component 340 based at least in part on the identified information being associated with a second signal, for reception at the serializer/deserializer 320 (e.g., via the reception component 340), that is responsive to the information.

In some examples, the information identification component 325 may be configured as or otherwise support a means for identifying second information to be transmitted by the serializer/deserializer 320 over the communication channel (e.g., via the transmission component 335). In some examples, the activation component 330 may be configured as or otherwise support a means for activating the transmission component 335 based at least in part on the information identification component 325 identifying the second information. In some examples, the activation component 330 may be configured as or otherwise support a means for refraining from activating the reception component 340 based at least in part on the second information not being associated with a response to the second information.

In some examples, to support the activation component 330 activating the transmission component 335 and the reception component 340, the power coupling component 345 may be configured as or otherwise support a means for coupling, based at least in part on the information identification component 325 identifying the information, the transmission component 335 with a power source. In some examples, to support the activation component 330 activating the transmission component 335 and the reception component 340, the power coupling component 345 may be configured as or otherwise support a means for coupling, based at least in part on the information identification component 325 identifying the information, the reception component 340 with the power source.

In some examples, to support the activation component 330 activating the transmission component 335 and the reception component 340, the power state management component 350 may be configured as or otherwise support a means for switching, based at least in part on the information identification component 325 identifying the information, the transmission component 335 from a first power state to a second power state. In some examples, to support the activation component 330 activating the transmission component 335 and the reception component 340, the power state management component 350 may be configured as or otherwise support a means for switching, based at least in part on information identification component 325 identifying the information, the reception component 340 from a third power state to a fourth power state.

In some examples, the reception component 340 may be configured as or otherwise support a means for receiving (e.g., at the serializer/deserializer 320) an indication of second information to be received by the serializer/deserializer 320 (e.g., via the reception component 340). In some examples, the power state management component 350 may be configured as or otherwise support a means for switching, based at least in part on the reception component 340 receiving the indication of the second information, the reception component 340 from the fourth power state to a fifth power state. In some examples, the fourth power state may be associated with powering a detection portion of the reception component 340. In some examples, the fifth power state may be associated with powering an output of the serializer/deserializer (e.g., an output component of the reception component 340) that is associated with outputting a deserialized signal.

In some examples, the activation component 330 may be configured as or otherwise support a means for deactivating the transmission component 335 after transmitting the signal and before deactivating the reception component 340.

Figure 4:
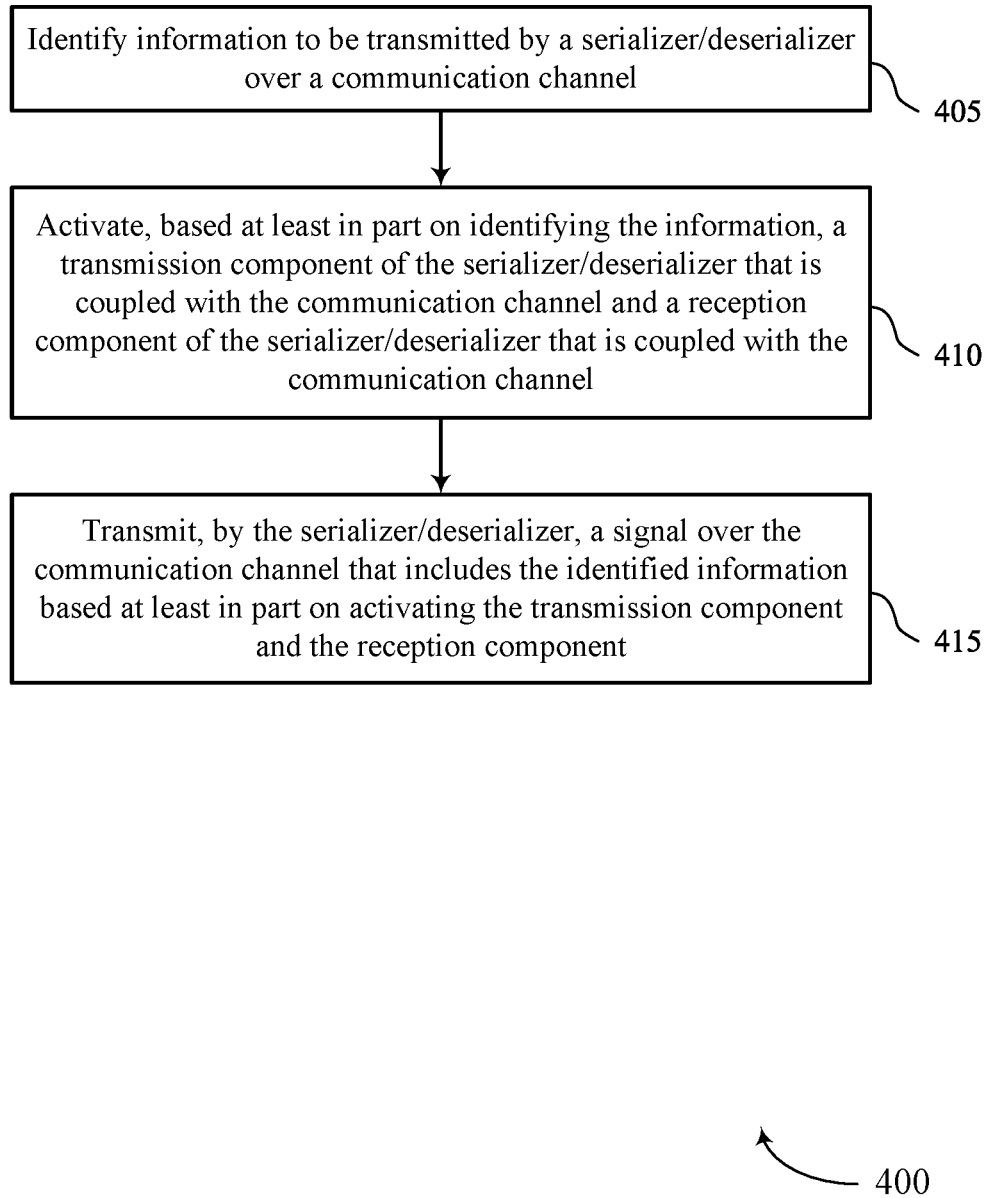
FIG. 4 shows a flowchart illustrating a method or methods that support techniques for enabling and disabling of a serializer/deserializer in accordance with examples as disclosed herein.

FIG. 4 shows a flowchart illustrating a method 400 that supports techniques for enabling and disabling of a serializer/deserializer in accordance with examples as disclosed herein. The operations of method 400 may be implemented by a serializer/deserializer or its components as described herein. For example, the operations of method 400 may be performed by a serializer/deserializer as described with reference to FIGS. 1 through 3. In some examples, a serializer/deserializer may execute a set of instructions to control the functional elements of the device to perform the described functions. Additionally or alternatively, the serializer/deserializer may perform aspects of the described functions using special-purpose hardware.

At 405, the method may include identifying information to be transmitted by a serializer/deserializer over a communication channel. The operations of 405 may be performed in accordance with examples as disclosed herein. In some examples, aspects of the operations of 405 may be performed by an information identification component 325 as described with reference to FIG. 3.

At 410, the method may include activating, based at least in part on identifying the information, a transmission component of the serializer/deserializer that is coupled with the communication channel and a reception component of the serializer/deserializer that is coupled with the communication channel. The operations of 410 may be performed in accordance with examples as disclosed herein. In some examples, aspects of the operations of 410 may be performed by an activation component 330 as described with reference to FIG. 3.

At 415, the method may include transmitting, by the serializer/deserializer, a signal over the communication channel that includes the identified information based at least in part on activating the transmission component and the reception component. The operations of 415 may be performed in accordance with examples as disclosed herein. In some examples, aspects of the operations of 415 may be performed by a transmission component 335 as described with reference to FIG. 3.

In some examples, an apparatus as described herein may perform a method or methods, such as the method 400. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for identifying information to be transmitted by a serializer/deserializer over a communication channel; activating, based at least in part on identifying the information, a transmission component of the serializer/deserializer that is coupled with the communication channel and a reception component of the serializer/deserializer that is coupled with the communication channel; and transmitting, by the serializer/deserializer, a signal over the communication channel that includes the identified information based at least in part on activating the transmission component and the reception component.

Aspect 2: The method, apparatus, or non-transitory computer-readable medium of aspect 1 where the transmission component of the serializer/deserializer is coupled with a first signal path of the communication channel and the reception component of the serializer/deserializer is coupled with a second signal path of the communication channel that is isolated from the first signal path.

Aspect 3: The method, apparatus, or non-transitory computer-readable medium of any of aspects 1 through 2 where activating the transmission component and the reception component is based at least in part on the identified information being associated with a second signal, for reception at the serializer/deserializer, that is responsive to the information.

Aspect 4: The method, apparatus, or non-transitory computer-readable medium of aspect 3, further including operations, features, circuitry, logic, means, or instructions, or any combination thereof for identifying second information to be transmitted by the serializer/deserializer over the communication channel; activating the transmission component based at least in part on identifying the second information; and refraining from activating the reception component based at least in part on the second information not being associated with a response to the second information.

Aspect 5: The method, apparatus, or non-transitory computer-readable medium of any of aspects 1 through 4, where activating the transmission component and the reception component includes operations, features, circuitry, logic, means, or instructions, or any combination thereof for coupling, based at least in part on identifying the information, the transmission component with a power source and coupling, based at least in part on identifying the information, the reception component with the power source.

Aspect 6: The method, apparatus, or non-transitory computer-readable medium of any of aspects 1 through 5, where activating the transmission component and the reception component includes operations, features, circuitry, logic, means, or instructions, or any combination thereof for switching, based at least in part on identifying the information, the transmission component from a first power state to a second power state and switching, based at least in part on identifying the information, the reception component from a third power state to a fourth power state.

Aspect 7: The method, apparatus, or non-transitory computer-readable medium of aspect 6, further including operations, features, circuitry, logic, means, or instructions, or any combination thereof for receiving, at the serializer/deserializer, an indication of second information to be received by the serializer/deserializer and switching, based at least in part on receiving the indication of the second information, the reception component from the fourth power state to a fifth power state.

Aspect 8: The method, apparatus, or non-transitory computer-readable medium of aspect 7, where the fourth power state is associated with powering a detection portion of the reception component and the fifth power state is associated with powering an output of the serializer/deserializer that is associated with outputting a deserialized signal.

Aspect 9: The method, apparatus, or non-transitory computer-readable medium of any of aspects 1 through 8, further including operations, features, circuitry, logic, means, or instructions, or any combination thereof for deactivating the transmission component after transmitting the signal and before deactivating the reception component.

It should be noted that the methods described above describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 10: An apparatus, including: a serializer operable for coupling with a communication channel; a deserializer operable for coupling with the communication channel; and circuitry configured to: identify information for communication over the communication channel via the serializer; activate, based at least in part on identifying the information, a transmission component associated with the serializer and a reception component associated with the deserializer; and transmit, via the transmission component, a signal over the communication channel that includes the identified information based at least in part on activating the transmission component and the reception component.

Aspect 11: The apparatus of aspect 10, where the transmission component associated with the serializer is operable for coupling with a first signal path of the communication channel; and the reception component associated with the deserializer is operable for coupling with a second signal path of the communication channel that is isolated from the first signal path.

Aspect 12: The apparatus of any of aspects 10 through 11, where the circuitry is configured to: activate the transmission component and the reception component based at least in part on the identified information being associated with a second signal, for reception via the reception component, that is responsive to the information.

Aspect 13: The apparatus of any of aspects 10 through 12, where, to activate the transmission component and the reception component, the circuitry is configured to: couple, based at least in part on identifying the information, the transmission component with a power source; and couple, based at least in part on identifying the information, the reception component with the power source.

Aspect 14: The apparatus of any of aspects 10 through 13, where, to activate the transmission component and the reception component, the circuitry is configured to: switch, based at least in part on identifying the information, the transmission component from a first power state to a second power state; and switch, based at least in part on identifying the information, the reception component from a third power state to a fourth power state.

Aspect 15: The apparatus of aspect 14, where the circuitry is configured to: receive an indication of second information for communication over the communication channel via the deserializer; and switch, based at least in part on receiving the indication of the second information, the reception component from the fourth power state to a fifth power state.

Aspect 16: The apparatus of aspect 15, where: the fourth power state is associated with powering a detection portion of the reception component; and the fifth power state is associated with powering an output of the deserializer that is associated with outputting a deserialized signal.

Aspect 17: The apparatus of any of aspects 10 through 16, where the circuitry is configured to: deactivate the transmission component after transmitting the signal and before deactivating the reception component.

An apparatus is described. The following provides an overview of aspects of the apparatus as described herein:

Aspect 18: An apparatus, including: a memory array; and a controller coupled with the memory array and operable for coupling with a host system via a communication channel, where the controller is configured to cause the apparatus to: identify information to be transmitted to the host system over the communication channel; activate, based at least in part on identifying the information, a transmission component of a serializer/deserializer that is coupled with the communication channel and a reception component of the serializer/deserializer that is coupled with the communication channel; and transmit, using the serializer/deserializer, a signal that includes the identified information to the host system via the communication channel based at least in part on activating the transmission component and the reception component.

Aspect 19: The apparatus of aspect 18, where: the transmission component of the serializer/deserializer is operable for coupling with a first signal path of the communication channel; and the reception component of the serializer/deserializer is operable for coupling with a second signal path of the communication channel that is isolated from the first signal path.

Aspect 20: The apparatus of any of aspects 18 through 19, where the controller is configured to cause the apparatus to: activate the transmission component and the reception component based at least in part on the identified information being associated with a second signal from the host system, for reception at the serializer/deserializer, that is responsive to the information.

Aspect 21: The apparatus of any of aspects 18 through 20, where the controller is configured to cause the apparatus to: deactivate the transmission component after transmitting the signal and before deactivating the reception component.

An apparatus is described. The following provides an overview of aspects of the apparatus as described herein:

Aspect 22: An apparatus, including: a controller configured to couple with a memory system over a communication channel, where the controller is configured to cause the apparatus to: identify information to be transmitted to the memory system over the communication channel; activate, based at least in part on identifying the information, a transmission component of a serializer/deserializer that is coupled with the communication channel and a reception component of the serializer/deserializer that is coupled with the communication channel; and transmit, using the serializer/deserializer, a signal that includes the identified information to the memory system via the communication channel based at least in part on activating the transmission component and the reception component.

Aspect 23: The apparatus of aspect 22, where: the transmission component of the serializer/deserializer is operable for coupling with a first signal path of the communication channel; and the reception component of the serializer/deserializer is operable for coupling with a second signal path of the communication channel that is isolated from the first signal path.

Aspect 24: The apparatus of any of aspects 22 through 23, where the controller is configured to cause the apparatus to: activate the transmission component and the reception component based at least in part on the identified information being associated with a second signal from the memory system, for reception at the serializer/deserializer, that is responsive to the information.

Aspect 25: The apparatus of any of aspects 22 through 24, where the controller is configured to cause the apparatus to: deactivate the transmission component after transmitting the signal and before deactivating the reception component.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   identifying information to be transmitted by a serializer/deserializer via a communication channel;
   activating, based at least in part on identifying the information to be transmitted, a transmission component of the serializer/deserializer that is coupled with the communication channel;
   activating, based at least in part on identifying the information to be transmitted and concurrently with activating the transmission component, a reception component of the serializer/deserializer that is coupled with the communication channel; and
   transmitting, by the serializer/deserializer, a signal via the communication channel that includes the identified information after the transmission component and the reception component are concurrently activated.

2. The method of claim 1, wherein:
   the transmission component of the serializer/deserializer is coupled with a first signal path of the communication channel; and
   the reception component of the serializer/deserializer is coupled with a second signal path of the communication channel that is isolated from the first signal path.

3. The method of claim 1, wherein the concurrent activation of the transmission component and the reception component is based at least in part on the identified information being associated with a second signal, for reception at the serializer/deserializer, that is responsive to the information.

4. The method of claim 3, further comprising:
   identifying second information to be transmitted by the serializer/deserializer via the communication channel;
   activating the transmission component based at least in part on identifying the second information to be transmitted; and
   refraining from activating the reception component based at least in part on the second information not being associated with a response to the second information.

5. The method of claim 1, wherein:
   activating the transmission component comprises coupling, based at least in part on identifying the information, the transmission component with a power source; and
   activating the reception component comprises coupling, based at least in part on identifying the information, the reception component with the power source.

6. The method of claim 1, wherein:
   activating the transmission component comprises switching, based at least in part on identifying the information, the transmission component from a first power state to a second power state; and activating the reception component comprises switching, based at least in part on identifying the information, the reception component from a third power state to a fourth power state.

7. The method of claim 6, further comprising:
receiving, at the serializer/deserializer, an indication of second information to be received by the serializer/deserializer; and
switching, based at least in part on receiving the indication of the second information, the reception component from the fourth power state to a fifth power state.

8. The method of claim 7, wherein:
the fourth power state is associated with powering a detection portion of the reception component; and
the fifth power state is associated with powering an output of the serializer/deserializer that is associated with outputting a deserialized signal.

9. The method of claim 1, further comprising:
deactivating the transmission component after transmitting the signal and before deactivating the reception component.

10. An apparatus, comprising:
a serializer operable for coupling with a communication channel;
a deserializer operable for coupling with the communication channel; and
circuitry configured to:
identify information for communication via the communication channel via the serializer;
activate, based at least in part on identifying the information, a transmission component associated with the serializer;
activate, based at least in part on identifying the information to be transmitted and concurrently with activating the transmission component, a reception component associated with the deserializer; and
transmit, via the transmission component, a signal via the communication channel that includes the identified information after the transmission component and the reception component are concurrently activated.

11. The apparatus of claim 10, wherein:
the transmission component associated with the serializer is operable for coupling with a first signal path of the communication channel; and
the reception component associated with the deserializer is operable for coupling with a second signal path of the communication channel that is isolated from the first signal path.

12. The apparatus of claim 10, wherein the circuitry is configured to:
activate the transmission component and the reception component concurrently based at least in part on the identified information being associated with a second signal, for reception via the reception component, that is responsive to the information.

13. The apparatus of claim 10, wherein:
to activate the transmission component, the circuitry is configured to couple, based at least in part on identifying the information, the transmission component with a power source; and
to activate the reception component, the circuitry is configured to couple, based at least in part on identifying the information, the reception component with the power source.

14. The apparatus of claim 10, wherein:
to activate the transmission component, the circuitry is configured to switch, based at least in part on identifying the information, the transmission component from a first power state to a second power state; and
to activate the reception component, the circuitry is configured to switch, based at least in part on identifying the information, the reception component from a third power state to a fourth power state.

15. The apparatus of claim 14, wherein the circuitry is configured to:
receive an indication of second information for communication via the communication channel via the deserializer; and
switch, based at least in part on receiving the indication of the second information, the reception component from the fourth power state to a fifth power state.

16. The apparatus of claim 15, wherein:
the fourth power state is associated with powering a detection portion of the reception component; and
the fifth power state is associated with powering an output of the deserializer that is associated with outputting a deserialized signal.

17. The apparatus of claim 10, wherein the circuitry is configured to:
deactivate the transmission component after transmitting the signal and before deactivating the reception component.

18. A memory system, comprising:
a memory array;
a serializer/deserializer operable for coupling with a host system via a communication channel; and
circuitry configured to cause the memory system to:
identify information to be transmitted to the host system via the communication channel;
activate, based at least in part on identifying the information to be transmitted, a transmission component of the serializer/deserializer that is coupled with the communication channel;
activate, based at least in part on identifying the information to be transmitted and concurrently with activating the transmission component, a reception component of the serializer/deserializer that is coupled with the communication channel; and
transmit, using the serializer/deserializer, a signal that includes the identified information to the host system via the communication channel after the transmission component and the reception component are concurrently activated.

19. The memory system of claim 18, wherein:
the transmission component of the serializer/deserializer is operable for coupling with a first signal path of the communication channel; and
the reception component of the serializer/deserializer is operable for coupling with a second signal path of the communication channel that is isolated from the first signal path.

20. The memory system of claim 18, wherein the circuitry is configured to-cause the memory system to:
activate the transmission component and the reception component concurrently based at least in part on the identified information being associated with a second signal from the host system, for reception at the serializer/deserializer, that is responsive to the information.

21. The memory system of claim 18, wherein the circuitry is configured to cause the memory system to:

deactivate the transmission component after transmitting the signal and before deactivating the reception component.

22. A host system, comprising:
a serializer/deserializer operable for coupling with a memory system via a communication channel; and
circuitry configured to cause the host system to:
identify information to be transmitted to the memory system via the communication channel;
activate, based at least in part on identifying the information to be transmitted, a transmission component of the serializer/deserializer that is coupled with the communication channel;
activate, based at least in part on identifying the information to be transmitted and concurrently with activating the transmission component, a reception component of the serializer/deserializer that is coupled with the communication channel; and
transmit, using the serializer/deserializer, a signal that includes the identified information to the memory system via the communication channel after the transmission component and the reception component are concurrently activated.

23. The host system of claim 22, wherein:
the transmission component of the serializer/deserializer is operable for coupling with a first signal path of the communication channel; and
the reception component of the serializer/deserializer is operable for coupling with a second signal path of the communication channel that is isolated from the first signal path.

24. The host system of claim 22, wherein the circuitry is configured to cause the host system to:
activate the transmission component and the reception component concurrently based at least in part on the identified information being associated with a second signal from the memory system, for reception at the serializer/deserializer, that is responsive to the information.

25. The host system of claim 22, wherein the circuitry is configured to cause the host system to:
deactivate the transmission component after transmitting the signal and before deactivating the reception component.

* * * * *